United States Patent [19]

Yukawa

[11] Patent Number: 5,010,347
[45] Date of Patent: Apr. 23, 1991

[54] ANALOG-TO-DIGITAL CONVERTER HAVING AN EXCELLENT SIGNAL-TO-NOISE RATIO FOR SMALL SIGNALS

[75] Inventor: Akira Yukawa, Tokyo, Japan

[73] Assignee: NEC Corporation, Tokyo, Japan

[21] Appl. No.: 249,158

[22] Filed: Sep. 26, 1988

[30] Foreign Application Priority Data

Sep. 25, 1987 [JP] Japan .................................. 62-24141
Sep. 25, 1987 [JP] Japan .................................. 62-24142
Oct. 1, 1987 [JP] Japan .................................. 62-249228

[51] Int. Cl.$^5$ ............................................ H03M 3/00
[52] U.S. Cl. ...................................... 341/143; 341/131
[58] Field of Search ............... 341/118, 131, 143, 164, 341/163

[56] References Cited

U.S. PATENT DOCUMENTS

| | | | |
|---|---|---|---|
| 4,097,860 | 6/1978 | Araseki et al. | 341/118 |
| 4,317,208 | 2/1982 | Araseki et al. | 341/143 |
| 4,439,756 | 3/1984 | Shenoi et al. | 341/143 |
| 4,509,037 | 4/1985 | Harris | 341/143 |
| 4,528,551 | 7/1985 | Agrawal et al. | 341/143 |
| 4,542,354 | 9/1985 | Robinton et al. | 341/118 |
| 4,733,219 | 3/1988 | Reusens et al. | 341/144 |
| 4,746,899 | 5/1988 | Swanson et al. | 341/122 |
| 4,761,634 | 8/1988 | Yamaguchi et al. | 341/131 |
| 4,775,851 | 10/1988 | Borth | 341/155 |

Primary Examiner—William M. Shoop, Jr.
Assistant Examiner—Randy W. Gibson
Attorney, Agent, or Firm—Sughrue, Mion, Zinn, Macpeak & Seas

[57] ABSTRACT

An analog-to-digital converter includes an analog-to-digital converting circuit having at least an analog signal input terminal, an adder having a first input connected to the analog signal input terminal and a second input, and a comparator having an input coupled to receive an output of the adder and operating to generate a digital signal at a given sampling frequency. This digital signal is applied to the second input of the adder. There is further provided a noise generator including a one-bit white noise generator connected to receive the digital signal outputted from the comparator for generating a one-bit white noise signal, and a circuit coupled to the white noise generator for outputting a signal indicative of a difference between values of two white noise signals at two continuous sampling points. This difference signal is added to the input of the comparator.

8 Claims, 5 Drawing Sheets

ANALOG-TO-DIGITAL CONVERTER HAVING AN EXCELLENT SIGNAL-TO-NOISE RATIO FOR SMALL SIGNALS

BACKGROUND OF THE INVENTION

1. Field of the Invention

The present invention relates to an analog-to-digital converter, and more specifically to an analog-to-digital converter for converting an input analog signal into a digital signal of a small bit number at a sampling rate which is considerably faster than the band of the input analog signal.

2. Description of Related Art

Conventionally, it has been an ordinary practice to convert an analog signal into a digital signal by sampling the input analog signal at a sampling frequency which is a double or triple of a maximum frequency of the input analog signal so that the digital signal obtained will have a high resolution. In this analog-to-digital conversion, since signal components of a frequency not smaller than one half of the sampling frequency are included as noise in the digital signal obtained, the input analog signal is previously filtered by a high precision filter so that the signal components of a frequency not smaller than one half of the sampling frequency are sufficiently attenuated before the analog-to-digital conversion. However, it is very difficult to form the high precision filter in an integrated circuit.

Under this circumstance, it has lately been proposed to convert an input analog signal into a digital signal by use of a relatively simple analog-to-digital converter at a frequency sufficiently higher than that of the analog signal and then to pick up only signals within a frequency band of the analog signal by means of a digital filter. The digital filter can have a high precision and reproductivity if the clock frequency is stable.

As the analog-to-digital converters of the type mentioned above, there have been known a variety of types such as a delta-sigma modulator type, a delta modulator type, a first-order predicate primary noise shaping type, etc.

A typical delta-sigma modulator type analog-to-digital converter includes an adder having an input connected to an analog signal input terminal and one integrator having an input connected to an output of the adder. An output of the integrator is connected to a comparator or threshold detector which operates to convert a received analog signal into a digital signal at a given sampling frequency. The digital signal is applied to a flipflop so that the digital signal is held for one period. An output of the flipflop is inverted by an inverter and then supplied to a second input of the above mentioned adder so that a voltage corresponding to a difference between the analog signal of the input terminal and the one-period delayed output of the comparator is integrated by the integrator.

In the above mentioned analog-to-digital converter, if the sampling frequency is very high, and assuming that the period of sampling is T and that the angular frequency of the input signal is $\omega$, a spectral power density of the noise is in proportion to $\sin^2(\omega T/2)$ and distributed in a biased frequency range higher than the band of the signal. Therefore, the degree of resolution is lower than that of the conventional analog-to-digital converter, but if it is evaluated in a band of the signal finally obtained, the in-band noise is low and a signal-to-noise ratio is high.

The first-order predicate primary noise shaping type analog-to-digital converter was proposed by Yukawa, A. et al in the International Conference on Acoustics, Speech, and Signal Processing in 1985. This first-order predicate primary noise shaping type analog-to-digital converter and the delta-modulator type analog-to-digital converter are advantageous, similarly to delta-sigma modulator type analog-to-digital converter, in that the sampling frequency is very high and a spectral power density of the noise is distributed in a biased frequency range higher than the band of the signal. Therefore, even if the degree of resolution is lower than that of the conventional analog-to-digital converter, if it is evaluated in a band of the signal finally obtained, the in-band noise is low and a signal-to-noise ratio is high.

However, the above mentioned three types of analog-to-digital converters have one common problem: When the input signal is small, a quantization noise is much distributed within the signal band because of the low resolution of the analog-to-digital conversion. As a result, the signal-to-noise ratio and the input/output amplitude characteristics are inevitably deteriorated.

In order to overcome this problem, it has been known to add a constant DC bias to the input, or to add a sine wave or rectangular wave signal having a frequency which is $\frac{1}{p}$ (p=integer) of the sampling rate and exceeds the band of the signal. This method is effective to some extent in preventing the deterioration of the above mentioned characteristics. In the latter method, however, the signal-to-noise ratio is remarkably decreased in a certain amplitude of the input signal which is determined by the amplitude and the frequency of the additional signal. As a consequence, the analog-to-digital converter as mentioned above cannot fulfil the required performance.

As mentioned above, the conventional analog-to-digital converters are disadvantageous in that an excellent signal-to-noise ratio and input/output amplitude characteristics cannot be realized for a small signal.

SUMMARY OF THE INVENTION

Accordingly, it is an object of the present invention to provide an analog-to-digital converter which has overcome the above mentioned defect of the conventional one.

Another object of the present invention is to provide an analog-to-digital converter having a high signal-to-noise ratio and an excellent input/output amplitude characteristics even when a small signal is inputted.

The above and other objects of the present invention are achieved in accordance with the present invention by an analog-to-digital converter which includes an analog-to-digital converting circuit having at least an analog signal input terminal, an adder means having a first input connected to the analog signal input terminal and a second input, and a comparator having an input coupled to receive an output of the adder and operating to generate a digital signal at a given sampling frequency, this digital signal being applied to the second input of the adder means, wherein the improvement comprises a noise generator including an one-bit white noise generator connected to receive the digital signal outputted from the comparator for generating a one-bit white noise signal, and means coupled to the white noise generator for outputting a signal indicative of a difference between values of two white noise signals at two continuous sampling points, this difference signal being added to the input of the comparator.

The above and other objects, features and advantages of the present invention will be apparent from the following description of preferred embodiments of the invention with reference to the accompanying drawings.

DESCRIPTION OF THE PREFERRED EMBODIMENTS

Figure 1:
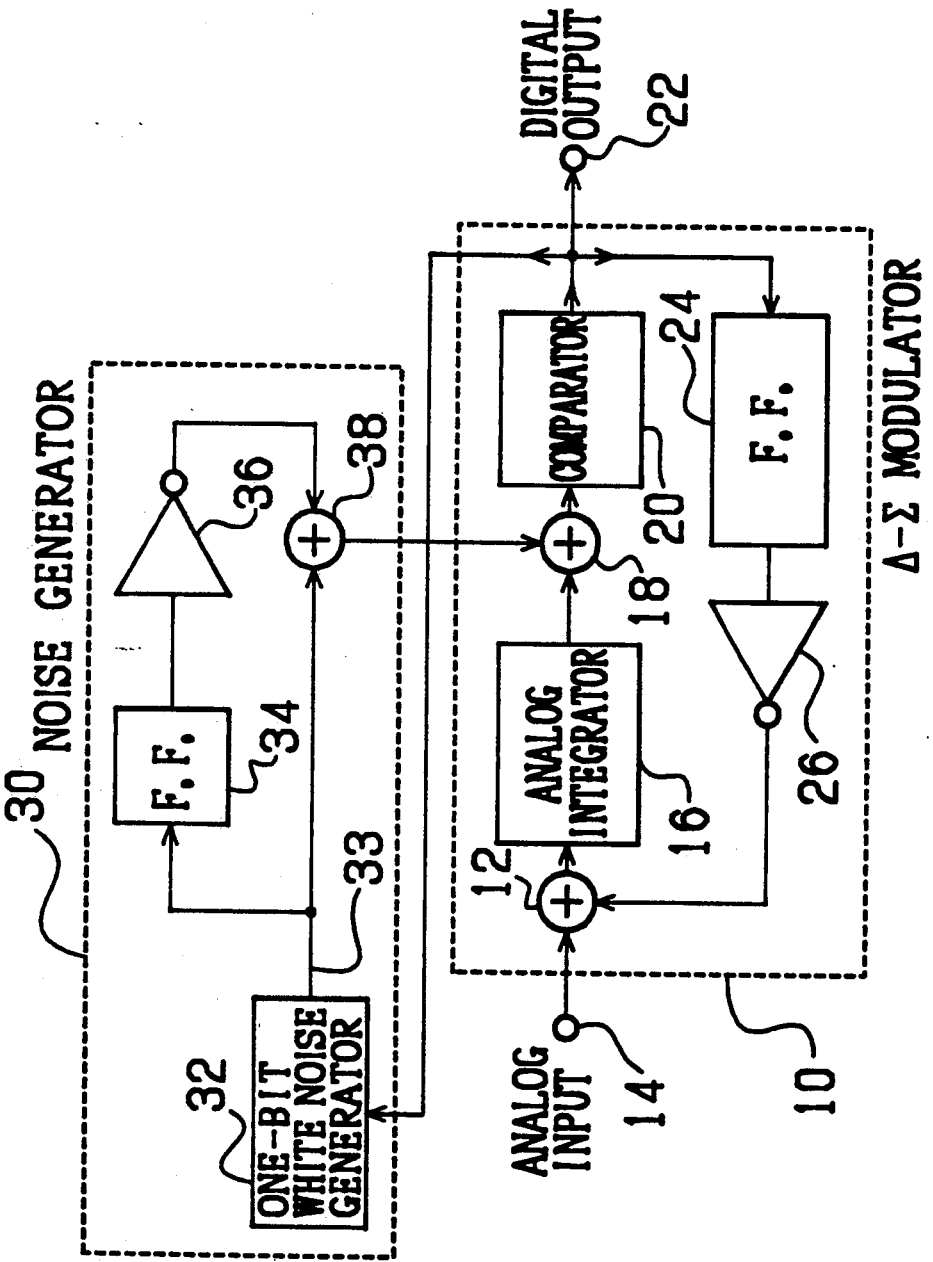
FIG. 1 is a block diagram of a first embodiment of the analog-to-digital converter in accordance with the present invention.

Referring to FIG. 1, there is shown a diagram of a first embodiment of the analog-to-digital converter in accordance with the present invention. The shown analog-to-digital converter includes a delta-sigma modulator 10 having one analog integrator, similarly to a conventional delta-sigma modulator having one integrator. The delta-sigma modulator 10 includes an adder 12 having an input connected to an analog signal input terminal 14 and one analog integrator 16 having an input connected to an output of the adder 12. An output of the integrator 16 is connected through another adder 18 to a threshold detector or comparator 20 which operates to convert a received analog signal into a digital signal at a given sampling rate or frequency. The digital signal is fed to an output terminal 22 and also is applied to a D-type flipflop 24 so that the digital signal is held for one period of the sampling frequency. An output of the flipflop 24 is coupled to an inverter 26 whose output is connected to a second input of the adder 12 so that a voltage corresponding to a difference between the analog signal of the input terminal 14 and the one-period delayed output of the comparator 20 is integrated by the integrator 16.

The shown analog-to-digital converter also includes a noise generator 30 which has a one-bit white noise generating circuit 32 connected at its input to the output of the comparator 20, and a D-type flipflop 34 connected to an output 33 of the one-bit white noise generating circuit 32 for generating a signal delayed by one sampling period. The one-sampling period delayed signal is inputted to an inverter 36. An output of the inverter 36 and the output 33 of the one-bit white noise generating circuit 32 are inputted to an adder 38 whose output is inputted to the adder 18 of the delta-sigma modulator 10. With this arrangement, the adder 38 generates a signal indicative of the difference between the outputs of the one-bit white noise generating circuit 32 at two succeeding sampling times. The output signal of the adder 38 can assume three values, "0", "1" and "2". When one of these values is added to the output of the integrator 16 by the adder 18, the value of "0" corresponds to "$-1$", and "1" and "2" correspond to "0" and "1", respectively. When the output of the adder 38 is inputted to the adder 18, the magnitude of the signal added to the adder 18 is preferably one-fourth to one-sixteenth of a voltage of the signal which is added for the output code "1" from the inverter 26 to the adder 12 so as to be fed back to the input analog signal of the input terminal 14.

Figure 2:
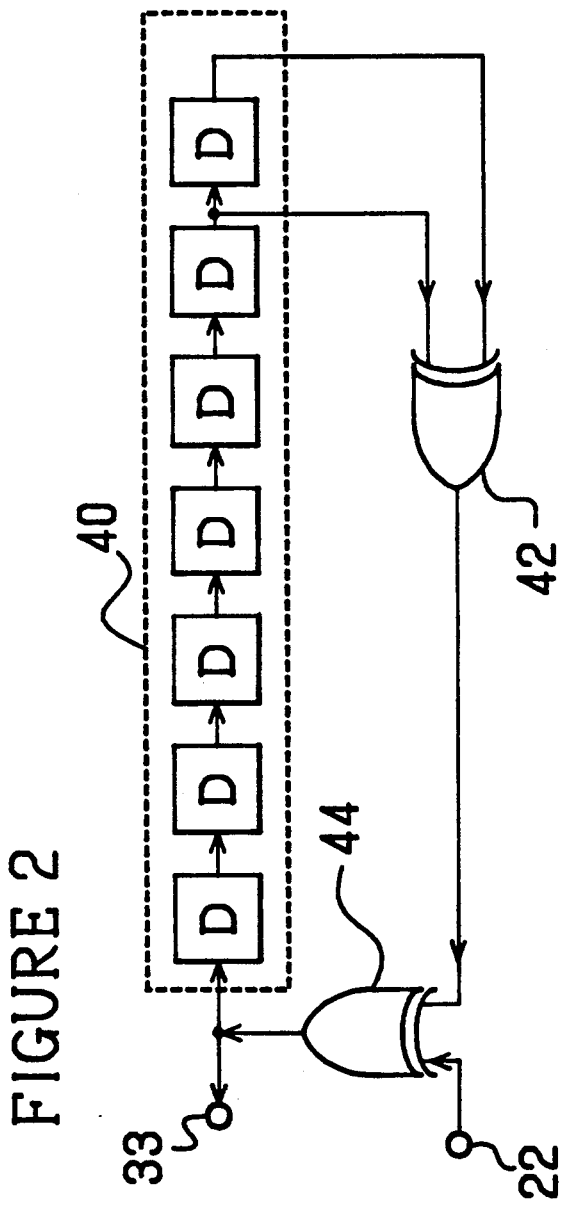
FIG. 2 is a block diagram of one embodiment of the one-bit white noise generator used in the analog-to-digital converter shown in FIG. 1.

The one-bit white noise generating circuit 32 can be formed by various circuits. Referring to FIG. 2, there is shown one typical white noise generating circuit which is called a "scrambler" and widely used in MODEMs. The shown one-bit white noise generating circuit 32 includes a seven-stage shift register 40 in which outputs of sixth and seventh stages are connected to an exclusive-OR gate 42. An output of the exclusive-OR gate 42 is connected to one input of a second exclusive-OR gate 44 whose second input is connected to receive the output of the comparator 20. An output of the second exclusive-OR gate 44 is connected to an input of a first stage of the shift register 40, and forms the output 33 of the one-bit white noise generating circuit 32.

Figure 3:
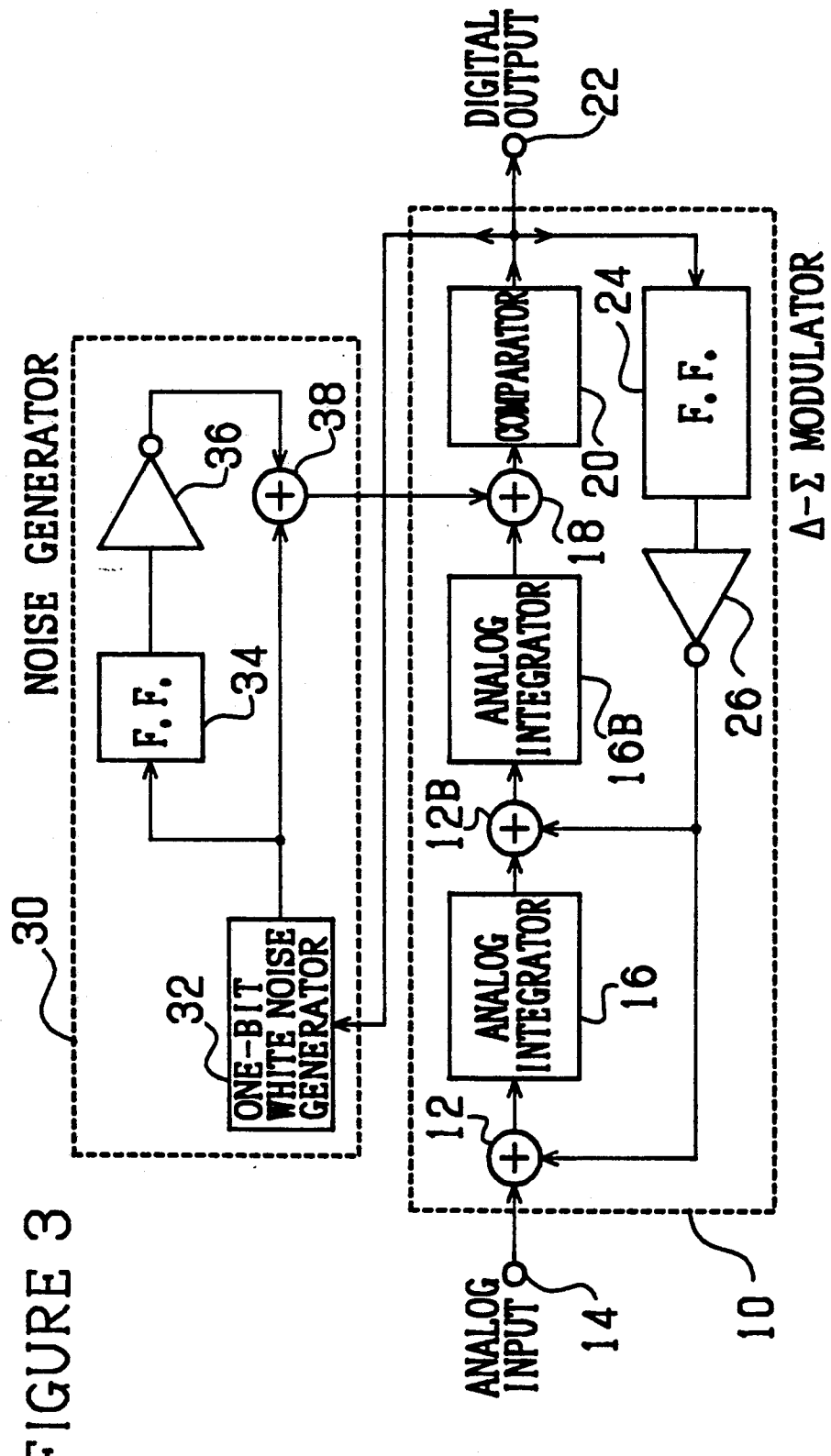
FIG. 3 is a block diagram similar to FIG. 1 but showing a second embodiment of an analog-to-digital converter in accordance with the present invention.

Turning to FIG. 3, there is shown a modified embodiment of the analog-to-digital converter shown in FIG. 1. In FIG. 3, therefore, elements similar to those shown in FIG. 1 are given the same Reference Numerals and explanation thereof will be omitted. In this modified embodiment, the delta-sigma modulator includes two integrators 16 and 16B which are cascade-coupled through an adder 12B. The output of the inverter 26 is connected to not only the adder 12 but also the adder 12B. With the double-integrator delta-sigma modulator, it can be expected that the spectral power density of the noise is in proportion to $\sin^2(\omega T/2)$ and distributed in a further biased frequency range higher than the band of the signal.

Also in this embodiment, when the output of the adder 38 is inputted to the adder 18, the magnitude of the signal added to the adder 18 is preferably one-fourth to one-sixteenth of a voltage of the signal which is added for the output code "1" from the inverter 26 to the adder 12 so as to be fed back to the input analog signal of the input terminal 14.

Figure 4:
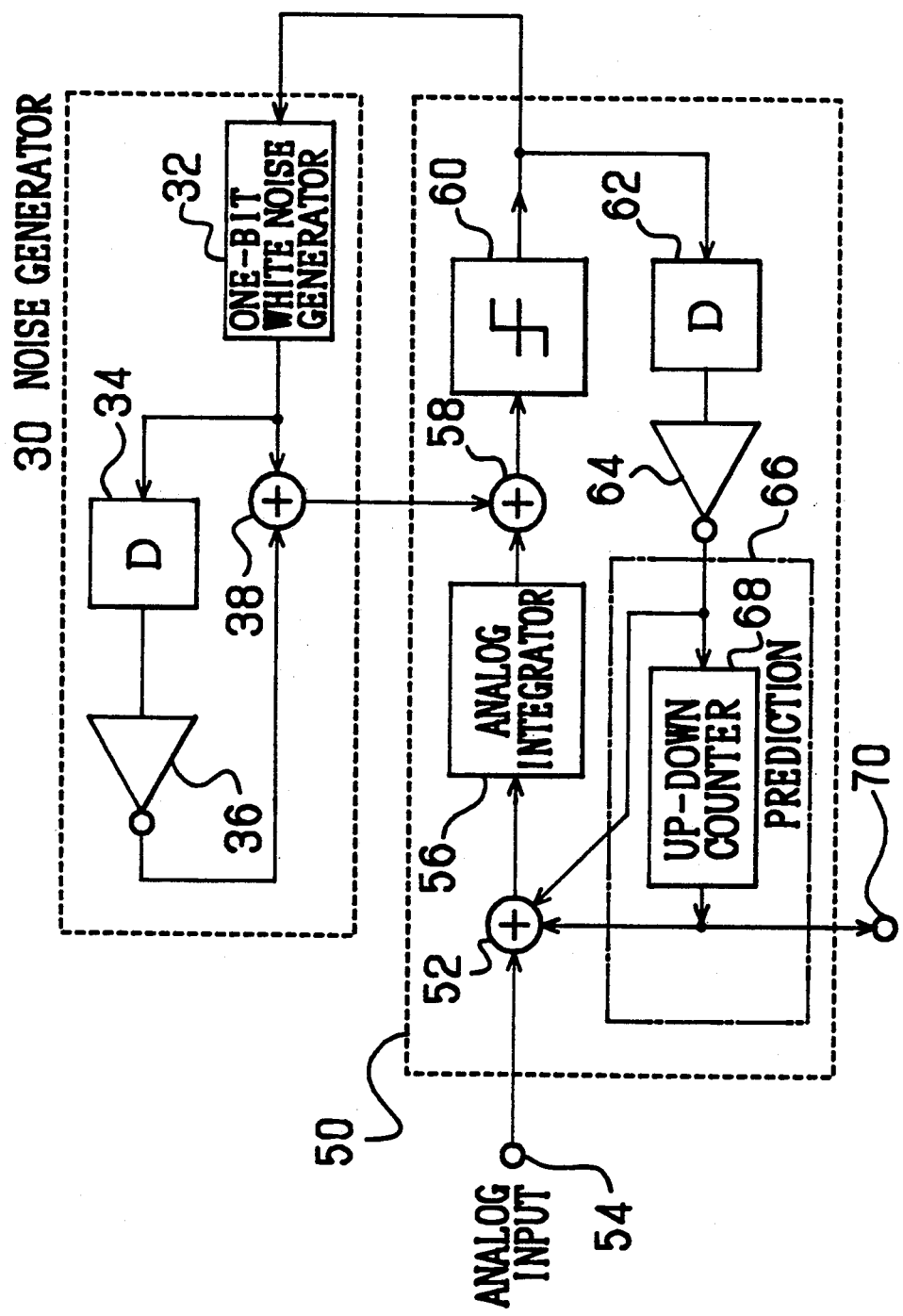
FIG. 4 is a block diagram similar to FIG. 1 but showing a third embodiment of an analog-to-digital converter in accordance with the present invention.

Referring to FIG. 4, there is shown a third embodiment of the analog-to-digital converter in accordance with the present invention. The shown converter includes the first-order predicate primary noise shaping type analog-to-digital conversion circuit 50, similar to a conventional first-order predicate primary noise shaping type analog-to-digital converter. The first-order predicate primary noise shaping type analog-to-digital conversion circuit 50 includes an adder 52 having an input connected to an analog signal input terminal 54 and one analog integrator 56 having an input connected to an output of the adder 52. An output of the integrator 56 is connected through another adder 58 to a threshold detector or comparator 60 which operates to convert a received signal into a digital signal at a given sampling rate or frequency, by discriminating whether the received signal is positive or negative. The output of the comparator 60 is fed to a D-type flipflop 62 so that the digital signal is held for one period of the sampling frequency. An output of the flipflop 62 is coupled to an inverter 64 whose output is connected to a prediction circuit 66. This prediction circuit 66 includes an up-down counter 68 for example, and an input and an output of the prediction circuit 66 are digital-to-analog-converted and then applied to second and third inputs of the adder 52 so that the adder 52 outputs the difference between the signal from the input terminal 54 and the signals from the prediction circuit 66. Further, the output of the prediction circuit 66 is connected to an output terminal 70.

The shown analog-to-digital converter also includes a noise generator 30 similar to that shown in FIG. 1. Namely, the output of the comparator 60 is connected to the input of the one-bit white noise generating circuit 32. In addition, the output of the adder 38 is connected to the adder 58. In this third embodiment, when the output of the adder 38 is inputted to the adder 58, the magnitude of the signal added to the adder 58 is preferably one-half to one-eighth of a minimum resolution of the prediction circuit 66 for the output code "1".

Figure 5:
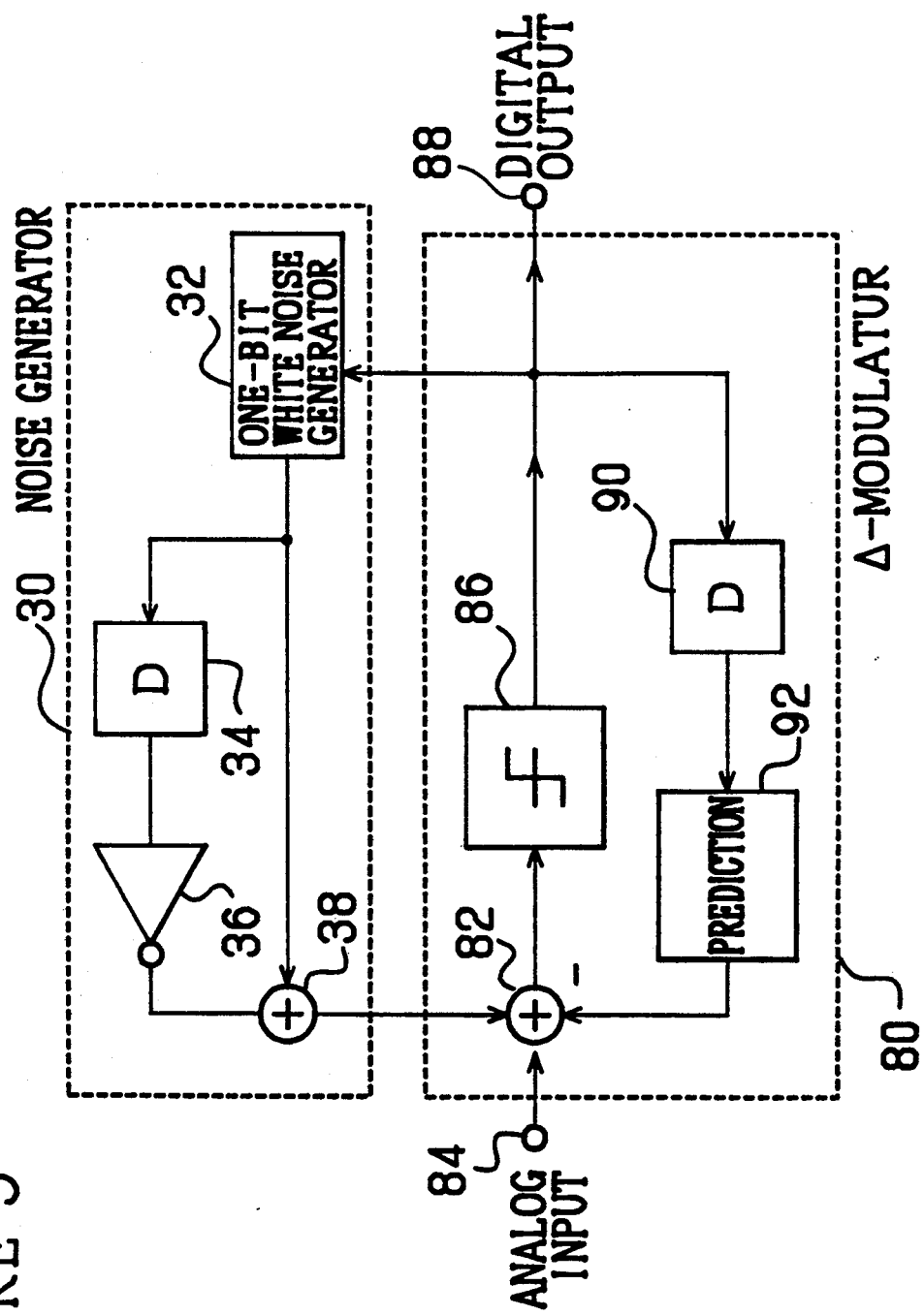
FIG. 5 is a block diagram similar to FIG. 1 but showing a fourth embodiment of an analog-to-digital converter in accordance with the present invention.

Referring to FIG. 5, there is shown a fourth embodiment of the analog-to-digital converter in accordance with the present invention. The shown converter includes a delta modulator 80, similar to a conventional delta modulator. The delta modulator 80 includes an adder 82 having a first input connected to an analog signal input terminal 84 and a threshold detector or comparator 86 having an input connected to an output of the adder 82. This threshold detector or comparator 86 operates to convert a received signal into a digital signal at a given sampling rate or frequency, by discriminating whether the received signal is positive or negative. The output of the comparator 86 is connected to an output terminal 88 and also fed to a D-type flipflop 90 so that the digital signal is held for one period of the sampling frequency. An output of the flipflop 90 is coupled to a prediction circuit 92, whose output is connected to a second input of the adder 82. The prediction circuit 92 can be formed of for example an up-down counter, similarly to the third embodiment shown in FIG. 4. However, if the prediction circuit 92 is of the digital type, the output of the prediction circuit 92 is firstly digital-to-analog-converted and thereafter is inputted to the adder 82. As seen from the above, the adder 82 is primarily provided for the purpose of discriminating which of the input signal and the predicted signal is large. If the input signal is larger than the predicted signal, the prediction circuit 92 outputs a digital code "1", so that the predicted signal generated by the prediction circuit 92 is enlarged.

The shown analog-to-digital converter also includes a noise generator 30 similar to that shown in FIG. 1. Namely, the output of the comparator 86 is connected to the input of the one-bit white noise generating circuit 32. In addition, the output of the adder 38 is connected to the adder 82. Also, in this fourth embodiment, when the output of the adder 38 is inputted to the adder 82, the magnitude of the signal added to the adder 82 is preferably one-half to one-eighth of a minimum resolution of the prediction circuit 92 for the output code "1".

In the above mentioned embodiments of the analog-to-digital converter, the noise is positively added. The meaning of the noise addition could be understood from evaluation of the power spectrum of the added noise. Now, assuming that the effective power of the amplitude of the newly added noise is $D^2$, the sampling period is T, and the angular frequency of the analog signal is $\omega$, the output of the adder 38 can have the power spectrum expressed by $D^2 \sin^2(\omega T/2)$. Namely, a signal component of a low frequency is very small, and an out-of-band spectral component is large. In the delta-sigma modulator, this spectrum is further converted into the distribution of $D^2 \sin^4(\omega T/2)$ in relation to the output signal in the case of the single integrator 16, and into a distribution of $D^2 \sin^6(\omega T/2)$ in the case of the two integrators 16A and 16B. The inventor plans to locate a digital filter connected to the output terminal (22, 70, 88) of the analog-to-digital converter so that the out-of-band components are removed by the digital filter, with the result that only the in-band components can be obtained. Therefore, even if an out-of-band noise is increased in relation to the quantization noise as the result of the positive addition of the above mentioned noise, the increase of the out-of-band noise is about 3 dB at most, and the performance of the analog-to-digital signal for the in-band signal component will not be deteriorated. On the other hand, with the positive addition of the noise, even if the input analog signal is small, an excellent signal-to-noise ratio can be obtained. In other words, the deterioration of the signal-to-noise ratio which is a significant problem in the prior art will not occur. Accordingly, according to the present invention, there can be realized a variety of analog-to digital converters which can fulfill various requirements.

The invention has thus been shown and described with reference to the specific embodiments. However, it should be noted that the present invention is in no way limited to the details of the illustrated structures but changes and modifications may be made within the scope of the appended claims.

What is claimed is:

1. An oversampled analog-to-digital converter which includes an analog-to-digital converting circuit having at least an analog signal input terminal, an adder means having a first input connected to the analog signal input terminal and a second input, and a comparator having an input coupled to receive an output of the adder means and operating to generate a digital signal at a given sampling frequency, this digital signal being applied to the second input of the adder means, wherein the improvement comprises a noise generator including a one-bit white noise generator connected to receive the digital signal outputted from the comparator for generating a one-bit white noise signal, and means coupled to the one-bit white noise generator for outputting a signal indicative of a difference between values of two white noise signals at two continuous sampling points, this difference signal being added to the input of the comparator, wherein said digital signal is generated without subtracting said one-bit white noise signal therefrom.

2. An analog-to-digital converter which includes an analog-to-digital converting circuit having at least an analog signal input terminal, an adder means having a first input connected to the analog signal input terminal and a second input, and a comparator having an input coupled to receive an output of the adder means and operating to generate a digital signal at a given sampling frequency, this digital signal being applied to the second input of the adder means, wherein the improvement comprises a noise generator including a one-bit white noise generator connected to receive the digital signal outputted from the comparator for generating a one-bit white noise signal, and means coupled to the one-bit white noise generator for outputting a signal indicative of a difference between values of two white noise signals at two continuous sampling points, this difference signal being added to the input of the comparator, wherein the one-bit white noise generator includes a multi-stage shift register, a first exclusive-OR gate connected to outputs of final and penultimate stages of the shift register, a second exclusive-OR gate having a first input connected to an output of the first exclusive-OR gate and a second input connected to receive the output of the comparator, an output of the second exclusive-OR gate being connected to an input of a first stage of the shift register, and forming the output of the one-bit white noise generating circuit.

3. An analog-to-digital converter claimed in claim 2 wherein the means coupled to the one-bit white noise generator includes a D-type flipflop connected to the output of the one-bit white noise generator for delaying the white noise signal for one period of the sampling frequency, an inverter connected to an output of the flipflop, and an adder connected to the output of the one-bit white noise generator and an output of the inverter for generating the signal indicative of the difference between values of two white noise signals at two continuous sampling points.

4. An oversampled analog-to-digital converter comprising:
a delta-sigma modulator having at least an analog signal input terminal, a first adder having a first input connected to the analog signal input terminal and a second input, an analog integrator connected to receive an output of the first adder, a second adder having a first input connected to an output of the integrator and a second input, and a comparator having an input coupled to receive an output of the second adder and operating to generate a digital signal at a given sampling frequency, a flipflop connected to receive the digital signal, and an inverter connected to an output of the flipflop and an output connected to the second input of the first adder; and
a noise generator including a one-bit white noise generator connected to receive the digital signal outputted from the comparator for generating a one-bit white noise signal, and means coupled to the one-bit white noise generator for outputting a signal indicative of a difference between values of two white noise signals at two continuous sampling points, this difference signal being added to the second input of the second adder, wherein said digital signal is generated without subtracting said one-bit white noise signal therefrom.

5. An oversampled analog-to-digital converter comprising:
a first-order predicate primary noise shaping analog-to-digital conversion circuit having at least an analog signal input terminal, a first adder having a first input connected to the analog signal input terminal and a second input, an analog integrator connected to receive an output of the first adder, a second adder having a first input connected to an output of the integrator and a second input, and a comparator having an input coupled to receive an output of the second adder and operating to generate a digital signal at a given sampling frequency, a flipflop connected to receive the digital signal, an inverter connected to an output of the flipflop, and a prediction circuit connected to receive an output of the inverter and an output connected to the second input of the first adder; and
a noise generator including a one-bit white noise generator connected to receive the digital signal outputted from the comparator for generating a one-bit white noise signal, and means coupled to the one-bit white noise generator for outputting a signal indicative of a difference between values of two white noise signals at two continuous sampling points, this difference signal being added to the second input of the second adder, wherein said digital signal is generated without subtracting said one-bit white noise signal therefrom.

6. An oversampled analog-to-digital converter comprising:
a delta modulator having at least an analog signal input terminal, an adder having a first input connected to the analog signal input terminal and a second input, and a comparator having an input coupled to receive an output of the adder and operating to generate a digital signal at a given sampling frequency, a flipflop connected to receive the digital signal, and a prediction circuit connected to receive an output of the flipflop and an output connected to the second input of the adder; and
a noise generator including a one-bit white noise generator connected to receive the digital signal outputted from the comparator for generating a one-bit white noise signal, and means coupled to the one-bit white noise generator for outputting a signal indicative of a difference between values of two white noise signals at two continuous sampling points, this difference signal being added to the input of the comparator, wherein said digital signal is generated without subtracting said one-bit white noise signal therefrom.

7. An analog-to-digital converter claimed in claim 1 wherein the means coupled to the one-bit white noise generator includes a D-type flipflop connected to the output of the one-bit white noise generator for delaying the white noise signal for one period of the sampling frequency, an inverter connected to an output of the flipflop, and an adder connected to the output of the one-bit white noise generator and an output of the inverter for generating the signal indicative of the difference between values of two white noise signals at two continuous sampling points.

8. An analog-to-digital converter claimed in claim 4 wherein the means coupled to the one-bit white noise generator includes a D-type flipflop connected to the output of the one-bit white noise generator for delaying the white noise signal for one period of the sampling frequency, an inverter connected to an output of the flipflop, and an adder connected to the output of the one-bit white noise generator and an output of the inverter for generating the signal indicative of the difference between values of two white noise signals at two continuous sampling points.

* * * * *

UNITED STATES PATENT AND TRADEMARK OFFICE
CERTIFICATE OF CORRECTION

PATENT NO. : 5,010,347

DATED : April 23, 1991

INVENTOR(S) : Akira Yukawa

It is certified that error appears in the above-identified patent and that said Letters Patent is hereby corrected as shown below:

Title page, item [30], should read as follows:
Priority Data    Sep. 25, 1987 [JP] Japan,
delete "62-24141" and insert --62-242141--.

Priority Data    Sep. 25, 1987 [JP] Japan,
delete "62-24142" and insert --62-242142--.

Priority Data    Oct. 1, 1987 [JP] Japan,
delete "62-249228" and insert --62-249448--.

Signed and Sealed this

Twenty-second Day of September, 1992

Attest:

DOUGLAS B. COMER

Attesting Officer    Acting Commissioner of Patents and Trademarks